United States Patent
Tanaka et al.

(10) Patent No.: US 10,492,292 B2
(45) Date of Patent: Nov. 26, 2019

(54) OPTICAL CIRCUIT BOARD SHEET AND OPTO-ELECTRIC HYBRID BOARD SHEET INCLUDING SAME

(71) Applicant: NITTO DENKO CORPORATION, Ibaraki-shi, Osaka (JP)

(72) Inventors: Naoyuki Tanaka, Ibaraki (JP); Yusuke Matsuoka, Ibaraki (JP); Yasuto Ishimaru, Ibaraki (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 16/098,593

(22) PCT Filed: Apr. 14, 2017

(86) PCT No.: PCT/JP2017/015319
§ 371 (c)(1),
(2) Date: Nov. 2, 2018

(87) PCT Pub. No.: WO2017/195529
PCT Pub. Date: Nov. 16, 2017

(65) Prior Publication Data
US 2019/0150275 A1 May 16, 2019

(30) Foreign Application Priority Data
May 9, 2016 (JP) ................................ 2016-093909

(51) Int. Cl.
*G02B 6/42* (2006.01)
*H05K 1/02* (2006.01)
(Continued)

(52) U.S. Cl.
CPC ........... *H05K 1/0274* (2013.01); *G02B 6/122* (2013.01); *G02B 6/12002* (2013.01);
(Continued)

(58) Field of Classification Search
None
See application file for complete search history.

(56) References Cited

U.S. PATENT DOCUMENTS

2009/0080848 A1\* 3/2009 Suzuki ................ G02B 6/1221
385/129
2011/0103738 A1 5/2011 Kim et al.
(Continued)

FOREIGN PATENT DOCUMENTS

| JP | 2010-164655 A | 7/2010 |
|---|---|---|
| JP | 2012-155035 A | 8/2012 |

(Continued)

OTHER PUBLICATIONS

Notification of Transmittal of Translation of the International Preliminary Report on Patentability (Form PCT/IB/338) issued in counterpart International Application No. PCT/JP2017/015319 dated Nov. 22, 2018, with Forms PCT/IB/373 and PCT/ISA/237. (7 pages).

(Continued)

*Primary Examiner* — Chad H Smith
(74) *Attorney, Agent, or Firm* — Westerman, Hattori, Daniels & Adrian, LLP

(57) ABSTRACT

An optical circuit board sheet which has little or no warpage to have no cracking in cores, and an opto-electric hybrid board sheet including the same are provided. The optical circuit board sheet includes: an insulative sheet; an under cladding layer formed on a first surface of the insulative sheet; and at least one core formed on a surface of the under cladding layer. A hole is formed in a portion of the surface of the under cladding layer other than where the core is formed. The area percentage of an opening area of the hole is in the range of 5% to 99% with respect to the first surface of the insulative sheet.

8 Claims, 6 Drawing Sheets

(51) Int. Cl.
G02B 6/122 (2006.01)
G02B 6/12 (2006.01)
G02B 6/138 (2006.01)
G02B 6/43 (2006.01)

(52) U.S. Cl.
CPC .............. G02B 6/138 (2013.01); H05K 1/02 (2013.01); H05K 1/0271 (2013.01); *G02B 6/428* (2013.01); *G02B 6/43* (2013.01)

(56) References Cited

U.S. PATENT DOCUMENTS

| | | | |
|---|---|---|---|
| 2012/0170887 A1* | 7/2012 | Yang | G02B 6/132 385/14 |
| 2012/0175794 A1* | 7/2012 | Takase | G02B 6/1221 264/1.27 |
| 2014/0126857 A1 | 5/2014 | Masuda et al. | |

FOREIGN PATENT DOCUMENTS

| | | |
|---|---|---|
| JP | 2013-120338 A | 6/2013 |
| JP | 2014-32255 A | 2/2014 |
| JP | 2014-95782 A | 5/2014 |
| JP | 2014-115480 A | 6/2014 |

OTHER PUBLICATIONS

International Search Report dated Jul. 4, 2017, issued in counterpart International Application No. PCT/JP2017/015319 (2 pages).

* cited by examiner

RELATED ART 51  54

RELATED ART

OPTICAL CIRCUIT BOARD SHEET AND OPTO-ELECTRIC HYBRID BOARD SHEET INCLUDING SAME

TECHNICAL FIELD

The present disclosure relates to an optical circuit board sheet including at least one core on a first surface of an insulative sheet, with an under cladding layer therebetween, and an opto-electric hybrid board sheet including at least one electric circuit on a second surface of the insulative sheet of the optical circuit board sheet.

BACKGROUND ART

With an increase in the amount of transmission information, optical circuits have been used in conjunction with electric circuits in recent electronic devices and the like. As an example, an opto-electric hybrid board R0 in which an electric circuit board E and an optical waveguide (optical circuit) W are stacked together, as shown in FIG. 9, has been proposed (see PTL 1, for example). The electric circuit board E includes an insulative substrate 51 and electric circuits 52 formed on the back surface of the insulative substrate 51. The optical waveguide W is formed on the front surface of the insulative substrate 51, and includes an under cladding layer 54 formed on the front surface of the insulative substrate 51, cores (optical path) 55 patterned on the front surface of the under cladding layer 54, and an over cladding layer 56 formed on the front surface of the under cladding layer 54 so as to cover the cores 55.

In general, the opto-electric hybrid board R0 is produced through a roll-to-roll step. Specifically, the production of the opto-electric hybrid board R0 is as follows. First, a roll obtained by winding a strip-shaped electric circuit board sheet in a roll form is prepared. The strip-shaped electric circuit board sheet includes a plurality of electric circuit boards E disposed at predetermined spacings. In the strip-shaped electric circuit board sheet, the electric circuits 52 disposed at predetermined spacings are formed on the back surface of an insulative strip-shaped sheet, and portions of the insulative strip-shaped sheet which correspond to the electric circuits 52 serve as the insulative substrate 51. While the electric circuit board sheet is unwound from the roll, the under cladding layer 54 is formed on the entire front surface (a surface on the opposite side from the surface on which the electric circuits 52 are formed) of the electric circuit board sheet by a photolithographic process. Subsequently, the cores 55 and the over cladding layer 56 are patterned in the order named on the front surface of the under cladding layer 54 by a photolithographic process. In this manner, a plurality of optical waveguides W are formed on the front surface of the strip-shaped electric circuit board sheet, so that a strip-shaped product cluster sheet is produced. Then, the strip-shaped product cluster sheet is passed through rollers and wound in a roll form. Thus, a product cluster roll is provided. Thereafter, the product cluster sheet is unwound from the product cluster roll and cut into opto-electric hybrid board sheets (with reference to FIG. 10) each having a predetermined number of opto-electric hybrid boards R0. In general, such an opto-electric hybrid board sheet is sized to have an area that can be exposed to light at a time during the formation of the optical waveguides W by a photolithographic process. Then, the opto-electric hybrid boards R0 are cut from the opto-electric hybrid board sheet.

In the opto-electric hybrid board sheet, the under cladding layer 54 is formed on the entire front surface, as shown in FIG. 10. The under cladding layer 54 is shown as shaded with broken diagonal lines in FIG. 10 for ease of understanding of the state of formation of the under cladding layer 54. The cores 55 and the over cladding layer 56 are not shown in FIG. 10.

RELATED ART DOCUMENT

Patent Document

PTL 1: JP-A-2010-164655

SUMMARY OF INVENTION

Unfortunately, there are cases in which cracking occurs in the cores 55 of the opto-electric hybrid boards R0 provided from the opto-electric hybrid board sheet. Cracking in the cores 55 precludes proper propagation of light. The present inventors hence have made investigation into the cause of the cracking in the cores 55. As a result, it has turned out that the cause lies in the fact that, when the under cladding layer 54 is formed on the entire front surface of the strip-shaped electric circuit board sheet in the course of the production of the opto-electric hybrid boards R0, the under cladding layer 54 shrinks on curing, so that a laminate comprised of the electric circuit board sheet and the under cladding layer 54 is warped in the width direction, with the under cladding layer 54 facing inward. If the cores 55 are formed on the laminate being warped and a resultant structure is thereafter passed between the rollers, the warped resultant structure is made flat. At this time, cracking occurs in the cores 55. In the roll-to-roll process, abase material for the production of the opto-electric hybrid board sheet is continuously pulled in a longitudinal direction. For this reason, the deformation in the direction of the flow of the base material (in the longitudinal direction) is restrained, so that deformation occurs in such a manner that the base material is warped in the width direction perpendicular to the direction of the flow of the base material as mentioned above.

The electric circuit board sheet in which the electric circuits 52 are previously formed on the back surface of the insulative strip-shaped sheet is used in the production of the aforementioned opto-electric hybrid board sheet. However, an insulative strip-shaped sheet on which the electric circuits 52 are not formed is used in some cases. In such cases, the opto-electric hybrid board sheet is produced in the following manner. First, the optical waveguides W are formed on the front surface of the insulative strip-shaped sheet. Then, the insulative strip-shaped sheet is cut into optical circuit board sheets each having a predetermined number of optical waveguides W. Thereafter, the electric circuits 52 are formed in predetermined positions on the back surface of the insulative strip-shaped sheet. In such cases, a laminate comprised of the insulative strip-shaped sheet and the under cladding layer 54 is warped in the same manner as described above. If the cores 55 are formed on the warped laminate and a resultant structure is thereafter passed between the rollers, cracking occurs in the cores 55.

The aforementioned warpage also occurs when the aforementioned optical circuit board sheets or the aforementioned opto-electric hybrid board sheets are produced by a batch process. In this case, the warpage occurs in all directions. Cracking also occurs in the cores 55 when the warped structure is made flat.

In view of the foregoing, it is therefore an object of the present disclosure to provide an optical circuit board sheet which has little or no warpage to have no cracking in cores, and an opto-electric hybrid board sheet including the same.

A first aspect of the present disclosure is intended for an optical circuit board sheet comprising: an insulative sheet; an under cladding layer formed on a first surface of the insulative sheet; and at least one core formed on a surface of the under cladding layer, wherein a hole is formed in a portion of the surface of the under cladding layer other than where the core is formed, and wherein the area percentage of an opening area of the hole is in the range of 5% to 99% with respect to the first surface of the insulative sheet.

A second aspect of the present disclosure is intended for an opto-electric hybrid board sheet comprising the optical circuit board sheet, and at least one electric circuit formed on a second surface of an insulative sheet of the optical circuit board sheet; wherein the opto-electric hybrid board sheet is configured to be cut into a plurality of opto-electric hybrid boards, each of the plurality of opto-electric hybrid boards comprising insulative substrate formed from a portion of the insulative sheet, and the electric circuit, the under cladding layer, and the core which are formed on the insulative substrate.

In the optical circuit board sheet according to the present disclosure, the under cladding layer is formed on the first surface of the insulative sheet, and the hole is formed in the surface of the under cladding layer. Thus, when the under cladding layer is formed on the first surface of the insulative sheet, the volume of the under cladding layer is reduced by the formation of the hole. That is, the amount of shrinkage on curing of the under cladding layer is smaller because of the smaller volume of the under cladding layer shrinking on curing. Also, at least a surface portion of the under cladding layer is divided into sections by the formation of the hole. This causes the shrinkage on curing of the surface portion of the under cladding layer to occur for each of the sections. In the sections, the amount of shrinkage is smaller because of the smaller volume of the under cladding layer shrinking on curing. The area percentage of the opening area of the hole is in the range of 5% to 99% with respect to the first surface of the insulative sheet. In accordance with the above, a laminate comprised of the insulative sheet and the under cladding layer has little or no warpage. As a result, the optical circuit board sheet according to the present disclosure also has little or no warpage to have no cracking in the core.

In particular, in the case where the area percentage of the opening area of the hole is in the range of 35% to 99% with respect to the first surface of the insulative sheet, the deformation due to shrinkage of the under cladding layer is further prevented. Accordingly, the optical circuit board sheet has less or no warpage to have no cracking in the core.

In particular, in the case where the hole is an elongated hole, the divided sections of the under cladding layer are elongated. This effectively prevents the optical circuit board sheet from being warped.

In particular, in the case where the elongated hole has an opening width of not less than 100 μm, the divided sections of the under cladding layer are made greater in area. This more effectively prevents the optical circuit board sheet from being warped.

In the opto-electric hybrid board sheet according to the present disclosure, the at least one electric circuit is formed on the second surface of the insulative sheet of the optical circuit board sheet. That is, the opto-electric hybrid board sheet according to the present disclosure includes the optical circuit board sheet and the electric circuit. Because of the combination of the effects of the optical circuit board sheet and the rigidity of the electric circuit, the opto-electric hybrid board sheet has little or no warpage to have no cracking in the core.

DESCRIPTION OF EMBODIMENTS

Next, embodiments according to the present disclosure will now be described in detail with reference to the drawings.

Figure 1A:
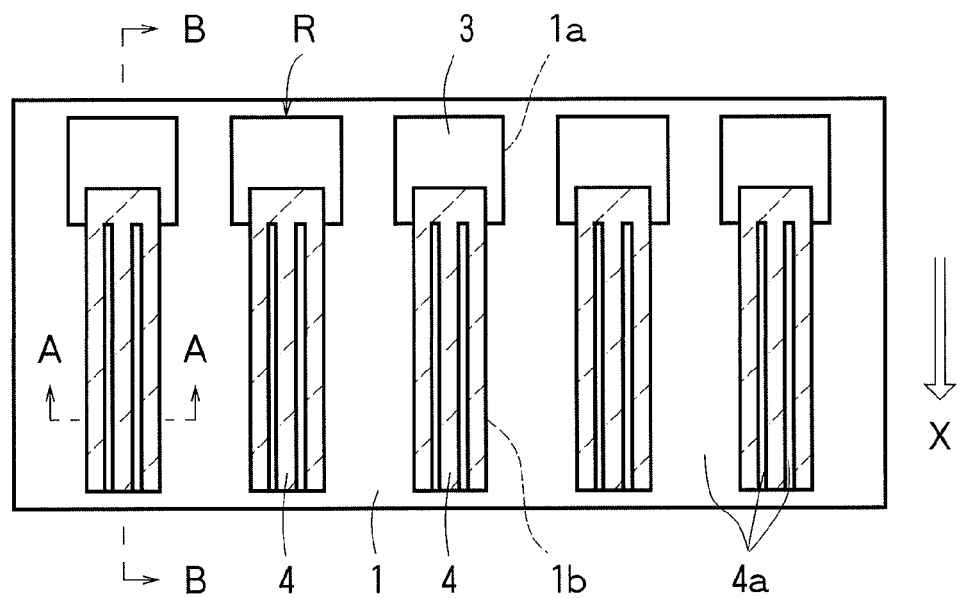
FIG. 1A is a schematic plan view showing a first embodiment of an opto-electric hybrid board sheet according to the present disclosure.
Figure 1B:
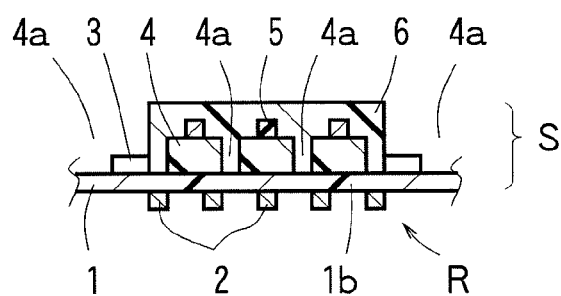
FIG. 1B is a schematic sectional view taken along the line A-A of FIG. 1A.
Figure 1C:
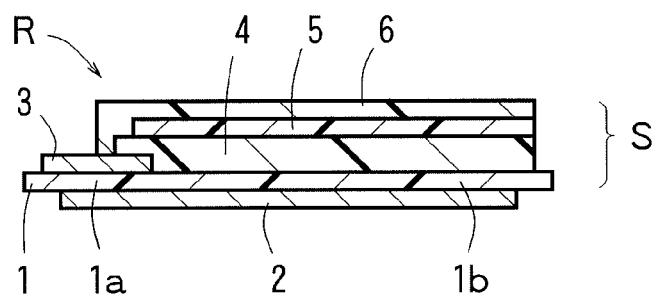
FIG. 1C is a schematic sectional view taken along the line B-B of FIG. 1A.

FIG. 1A is a plan view showing a first embodiment of an opto-electric hybrid board sheet according to the present disclosure. FIG. 1B is a sectional view taken along the line A-A of FIG. 1A. FIG. 1C is a sectional view taken along the line B-B of FIG. 1A. The opto-electric hybrid board sheet of the first embodiment is produced through a roll-to-roll step as described earlier. In the roll-to-roll step, a base material for the production of the opto-electric hybrid board sheet shall flow in an X direction as shown. The opto-electric hybrid board sheet includes a plurality of (in the figures, five) opto-electric hybrid boards (products) R. The opto-electric hybrid boards R are arranged in spaced parallel relation in a width direction perpendicular to the X direction. The opto-electric hybrid board sheet includes an insulative sheet 1, electric circuits 2, a stainless steel layer 3, an under cladding layer 4, cores 5, and an over cladding layer 6.

For ease of understanding of the configuration of the opto-electric hybrid board sheet, the number of components and the dimensional ratio thereof shown in FIGS. 1A to 1C are different more or less from the actual ones. The under cladding layer 4 is shown as shaded with broken diagonal lines in FIG. 1A for ease of understanding of the shape and state of the under cladding layer 4. The cores 5 and the over cladding layer 6 are not shown in FIG. 1A. A portion designated by the reference character S in FIGS. 1B and 1C corresponds to an optical circuit board sheet to be described later.

The configuration of the opto-electric hybrid board sheet will be described in further detail. The insulative sheet 1 is equal in size to the opto-electric hybrid board sheet. A portion of the insulative sheet 1 which corresponds to each of the opto-electric hybrid boards R becomes an insulative substrate constituting each of the opto-electric hybrid boards R by cutting. The insulative substrate in the first embodiment includes a square portion 1a as seen in plan view which is an upper end portion (with reference to FIG. 1A) for mounting an optical element (not shown) thereon, and a rectangular portion 1b as seen in plan view for core formation which extends integrally from the square portion 1a. The rectangular portion 1b is narrower in width than the square portion 1a and extends longer in the X direction. The electric circuits 2 are patterned in portions of the back surface (second surface) (with reference to FIGS. 1B and 1C) of the insulative sheet 1 which correspond to the opto-electric hybrid boards R. The stainless steel layer 3 is a reinforcement layer for the mounting of the optical element, and is formed on the front surface of the square portion 1a of the insulative substrate.

The under cladding layer 4 in the first embodiment is formed on a portion of the front surface of the stainless steel layer 3 and on the front surface (first surface) of the rectangular portion 1b of the insulative substrate (with reference to FIGS. 1B and 1C). A portion of the under cladding layer 4 which is formed on the rectangular portion 1b of the insulative substrate has elongated holes (slotted holes) 4a extending in the X direction (roll-to-roll flow direction) and formed through the under cladding layer 4 (in the form of slits). The under cladding layer 4 is not formed on a portion of the insulative sheet 1 which corresponds to other than each of the opto-electric hybrid boards R. The portion of the insulative sheet 1 on which the under cladding layer 4 is not formed in this manner performs the same function as the holes 4a formed in the under cladding layer 4, and shall be included in the holes 4a in the present disclosure. Thus, the area percentage of the opening area of the holes 4a is in the range of 5% to 99% with respect to the front surface (first surface) of the insulative sheet 1. This is a feature of the present disclosure. The cores 5 are formed on front surface portions of the under cladding layer 4 which correspond to the opto-electric hybrid boards R. The over cladding layer 6 is formed on the front surface of the insulative sheet 1 so as to cover the under cladding layer 4 and the cores 5 corresponding to the opto-electric hybrid boards R.

The opto-electric hybrid board sheet is produced through the roll-to-roll step in a manner to be described below. First prepared are a first roll obtained by winding a strip-shaped electric circuit board sheet in a roll form and a second roll obtained by winding a strip-shaped stainless steel sheet (having a thickness of 10 to 70 μm) in a roll form. The strip-shaped electric circuit board sheet includes the aforementioned electric circuit boards disposed at predetermined spacings. The electric circuit board sheet in the first roll includes: an insulative strip-shaped sheet serving as a parent material and configured such that the insulative sheet 1 (having a thickness of 1 to 20 μm) made of a polyimide resin or the like is continuously elongated in a strip shape; and the electric circuits 2 (having a thickness of 1 to 20 μm) distributed on the back surface of portions of the insulative strip-shaped sheet which become the insulative substrates. Next, the electric circuit board sheet is unwound from the first roll, and the stainless steel sheet is unwound from the second roll. The stainless steel sheet is bonded with an adhesive agent to the front surface of the electric circuit board sheet (insulative strip-shaped sheet). Subsequently, most of the stainless steel sheet other than a portion to be left as the stainless steel layer 3 for reinforcement is removed by etching, so that the insulative strip-shaped sheet is uncovered in a site where the stainless steel sheet is removed.

Next, a photosensitive epoxy resin or the like is applied to the uncovered front surface (a surface on the opposite side from the surface on which the electric circuits 2 are formed) of the insulative strip-shaped sheet. A portion of the applied layer which is to be left as the under cladding layer 4 is exposed to light through a photomask (portions which become the holes 4a are not exposed to light). Thereafter, unexposed portions are removed by development (a photolithographic process), so that the under cladding layer 4 (having a thickness of 1 to 100 μm) is formed into the aforementioned pattern (with reference to FIG. 1A). Subsequently, the cores 5 (having a thickness of 10 to 80 μm) and the over cladding layer 6 (having a thickness of 3 to 500 μm as measured from the top surface of the cores 5) are formed in the order named into the aforementioned pattern on the front surface of the under cladding layer 4 by a photolithographic process with the use of a photosensitive epoxy resin or the like as a material for the formation thereof. In this manner, a strip-shaped product cluster sheet including the strip-shaped electric circuit board sheet, the under cladding layer 4, the cores 5, and the over cladding layer 6 is produced, and is wound in a roll form. Thus, a product cluster roll is provided. Thereafter, the product cluster sheet is unwound from the product cluster roll, and is cut into the opto-electric hybrid board sheets. In such an opto-electric hybrid board sheet in the first embodiment, the insulative sheet 1 is uncovered in portions other than the opto-electric hybrid boards R (with reference to FIG. 1A). Then, the opto-electric hybrid boards R are cut from the opto-electric hybrid board sheet.

In the roll-to-roll step, the portion where the under cladding layer 4 is not formed is provided on the insulative strip-shaped sheet (insulative sheet 1) of the electric circuit board sheet (i.e., the holes 4a are formed in the front surface of the under cladding layer 4), whereby the volume of the under cladding layer 4 shrinking on curing is decreased. Accordingly, the amount of shrinkage on curing of the under cladding layer 4 is decreased.

In the first embodiment, the portion of the under cladding layer 4 which is formed on the rectangular portion 1b of the insulative substrate in each of the opto-electric hybrid boards R has elongated holes 4a in the form of slits extending in the direction of the flow of the base material for production in the roll-to-roll process (in the X direction). Thus, the under cladding layer 4 is divided into sections in the width direction perpendicular to the X direction, so that the shrinkage on curing of the under cladding layer 4 occurs for each of the sections. In these sections, the volume of the under cladding layer 4 shrinking on curing is decreased. Accordingly, the amount of shrinkage is decreased.

The area percentage of the opening area of the holes 4a is in the range of 5% to 99% with respect to the front surface of the insulative sheet 1. In accordance with the above, a laminate comprised of the strip-shaped electric circuit board sheet and the under cladding layer 4 has little or no warpage in the width direction perpendicular to the X direction. The formation of the cores 5 or the like is performed in a stable manner because the laminate has little or no warpage in and after the subsequent core formation step. This causes no cracking in the cores 5 if the laminate passes through rollers.

Figure 2:
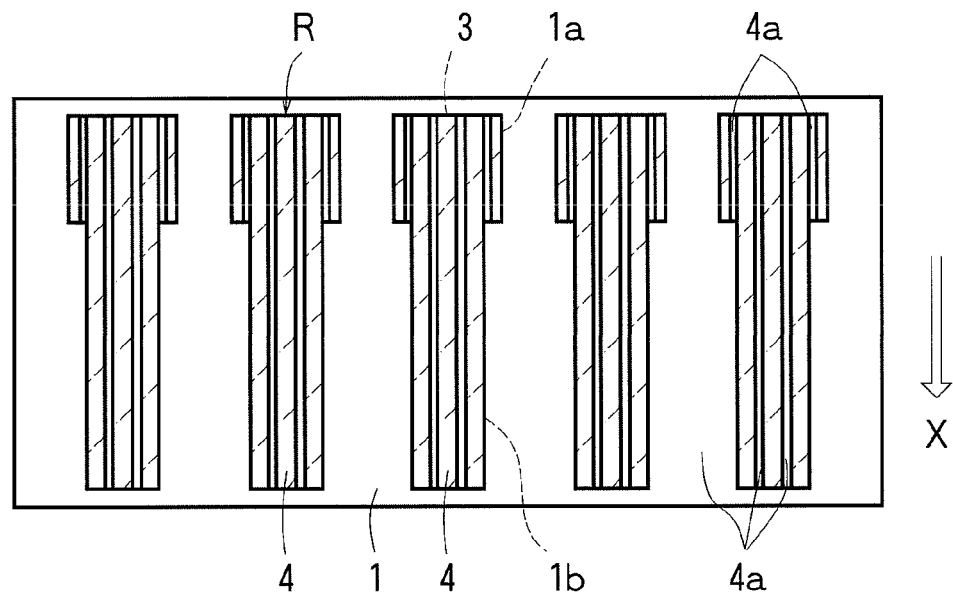
FIG. 2 is a schematic plan view showing a modification of the opto-electric hybrid board sheet.

The under cladding layer 4 is formed so as to cover a portion of the front surface of the stainless steel layer 3 in the first embodiment, but is formed in some cases so as to cover the entire front surface of the stainless steel layer 3, as required. In such cases, the under cladding layer 4 on the front surface of the stainless steel layer 3 may also have the elongated holes 4a extending in the X direction and formed through the under cladding layer 4 (in the form of slits), as shown in FIG. 2 in plan view. In this example, if the under cladding layer 4 is wide, the warpage of the aforementioned laminate is prevented because the elongated holes 4a divide the under cladding layer 4 into sections.

Figure 3:
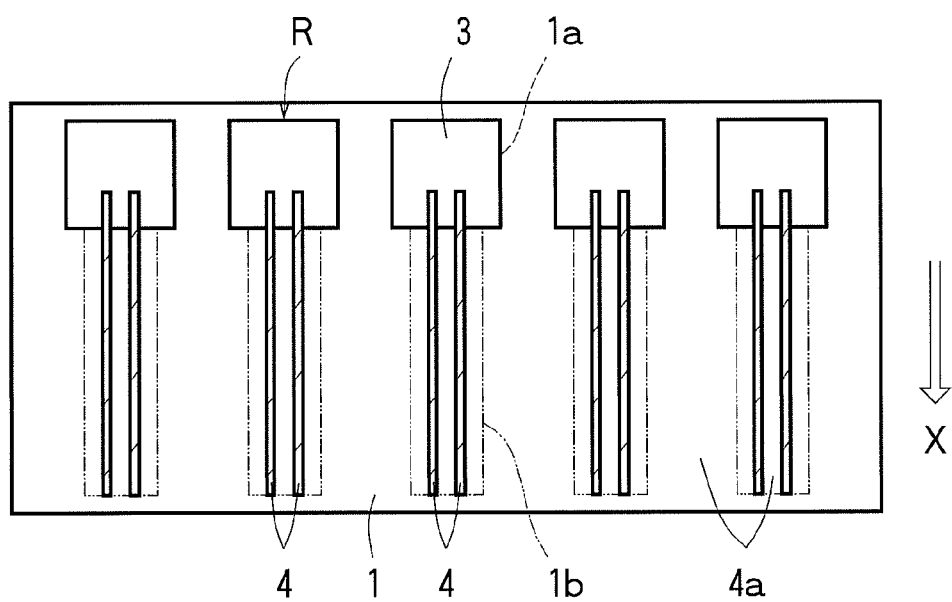
FIG. 3 is a schematic plan view showing another modification of the opto-electric hybrid board sheet.

The holes 4a are not formed in the portion of the under cladding layer 4 which lies on the front surface of the stainless steel layer 3 in the first embodiment. However, the holes 4a may be formed also in that portion, so that the holes 4a similar to those described above extend along the entire length of the under cladding layer 4, as shown in FIG. 3 in plan view. In this example, the warpage of the aforementioned laminate is further prevented because the under cladding layer 4 is further divided into sections. In FIG. 3, two sections of the under cladding layer 4 are shown as formed in each of the opto-electric hybrid boards R.

Figure 4:
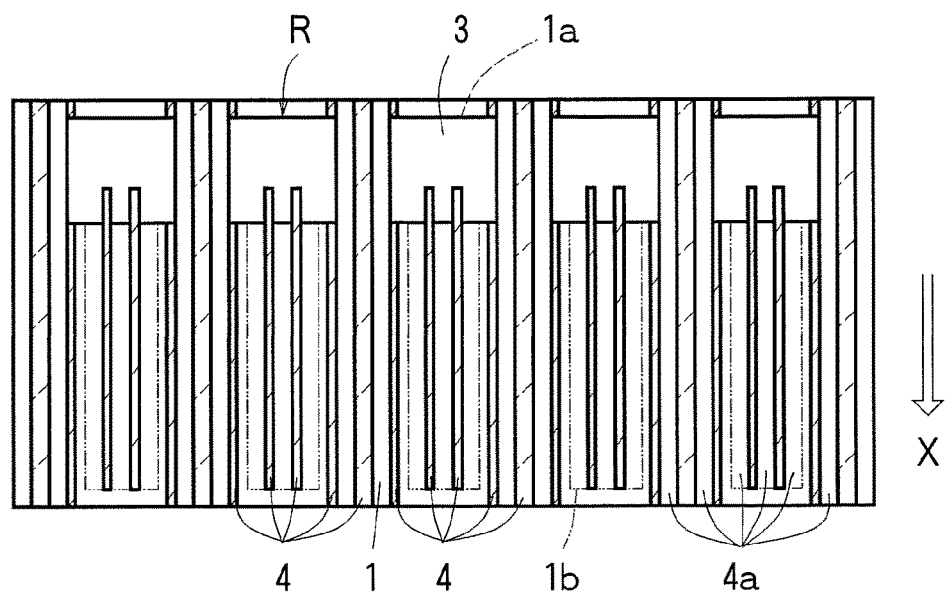
FIG. 4 is a schematic plan view showing a second embodiment of the opto-electric hybrid board sheet according to the present disclosure.

FIG. 4 is a plan view showing a second embodiment of the opto-electric hybrid board sheet according to the present disclosure. The opto-electric hybrid board sheet according to the second embodiment is configured such that the under cladding layer 4 is further formed in portions other than portions corresponding to the opto-electric hybrid boards R in the opto-electric hybrid board sheet shown in FIG. 3. The under cladding layer 4 has the elongated holes 4a extending in the direction of the flow of the base material for production in the roll-to-roll process (in the X direction) and formed through the under cladding layer 4 (in the form of slits). The remaining parts are similar to those of the opto-electric hybrid board sheet shown in FIG. 3, and like reference numerals and characters are used to designate similar parts.

In the second embodiment, the under cladding layer 4 formed on the front surface of the insulative sheet 1 has additional portions, but the holes 4a are formed in the under cladding layer 4 having the additional portions. Accordingly, the amount of shrinkage on curing of the under cladding layer 4 is decreased. Thus, the laminate comprised of the strip-shaped electric circuit board sheet and the under cladding layer 4 has little or no warpage. This causes no cracking in the cores 5.

In the second embodiment, the under cladding layer 4 is formed around the insulative substrate in each of the opto-electric hybrid boards R. Thus, when a liquid material for core formation is applied in the step of forming the cores 5, the front surface of a layer of the liquid material becomes flat. That is, the liquid material layer has a uniform thickness. This is advantageous in that the cores 5 formed from the liquid material layer have a uniform thickness. This achieves uniform light propagation in the cores 5 to provide the opto-electric hybrid boards R with high reliability.

Figure 5:
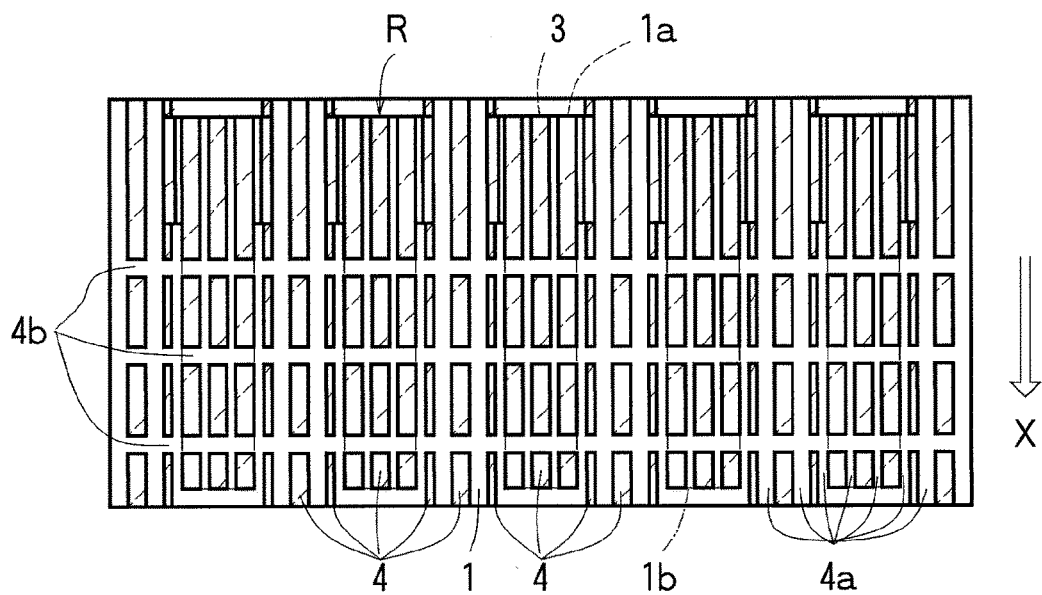
FIG. 5 is a schematic plan view showing a modification of the opto-electric hybrid board sheet.
Figure 6:
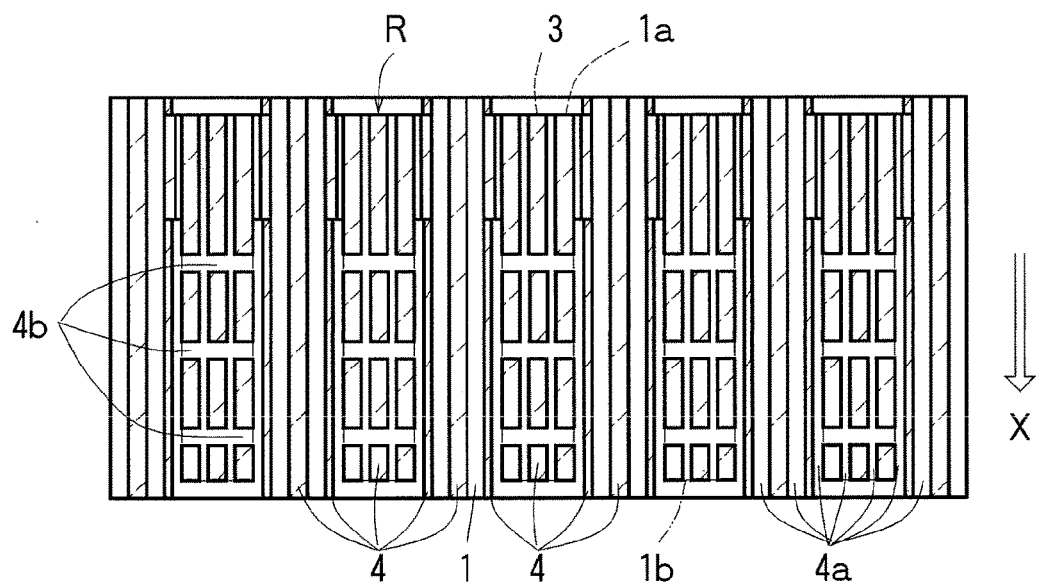
FIG. 6 is a schematic plan view showing another modification of the opto-electric hybrid board sheet.
Figure 7:
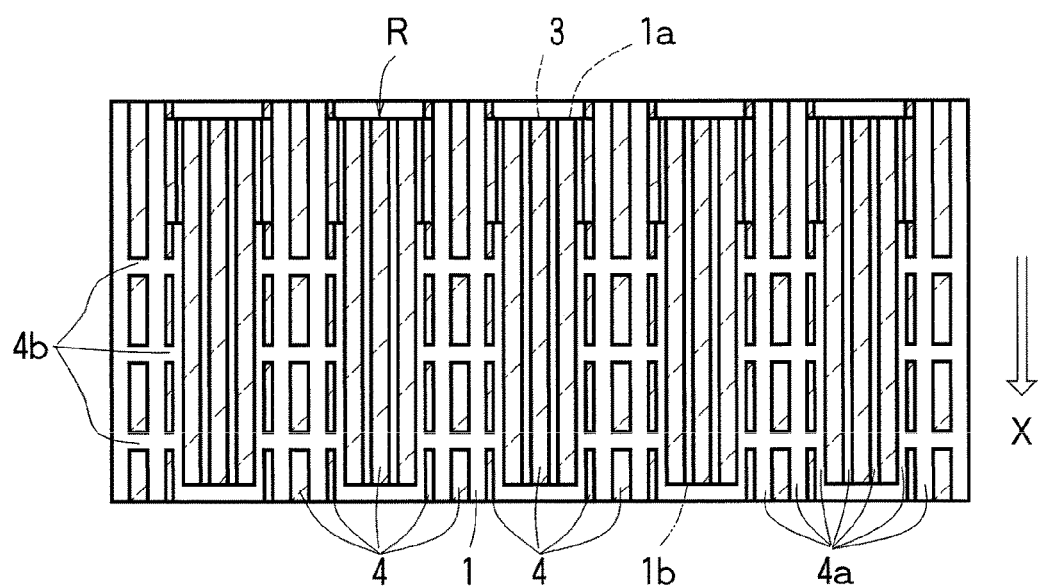
FIG. 7 is a schematic plan view showing still another modification of the opto-electric hybrid board sheet.

The elongated holes 4a formed in the under cladding layer 4 extend in the X direction in the second embodiment. As shown in FIGS. 5 to 7 in plan view (the under cladding layer 4 in each of the opto-electric hybrid boards R in FIGS. 5 to 7 corresponds to the under cladding layer 4 in FIG. 2), elongated holes 4b (in FIGS. 5 to 7, three holes 4b) extending in the width direction perpendicular to the X direction may be formed in addition to the holes 4a. In the opto-electric hybrid board sheet shown in FIG. 5, the holes 4b extending in the width direction are formed in portions of the under cladding layer 4 corresponding to the opto-electric hybrid boards R and in portions of the under cladding layer 4 corresponding to portions other than the opto-electric hybrid boards R. In the opto-electric hybrid board sheet shown in FIG. 6, the holes 4b extending in the width direction are formed in portions of the under cladding layer 4 corresponding to the opto-electric hybrid boards R. In the opto-electric hybrid board sheet shown in FIG. 7, the holes 4b extending in the width direction are formed in portions of the under cladding layer 4 corresponding to portions other than the opto-electric hybrid boards R. In these examples, the warpage of the aforementioned laminate is further prevented because the under cladding layer 4 is divided into more sections.

The elongated holes 4a formed in the under cladding layer 4 mainly extend in the X direction in the aforementioned embodiments, but may extend at an angle with respect to the X direction.

Further, the holes 4a and 4b formed in the under cladding layer 4 are elongated or slotted holes in the aforementioned embodiments, but may be other holes. For example, the holes 4a and 4b may be holes (short holes) each having a circular or polygonal opening area. In the opto-electric hybrid board sheet shown in FIG. 8 in plan view, for example, the under cladding layer 4 is formed in a portion corresponding to each of the opto-electric hybrid boards R, and partially has holes (short holes) 4c each having a circular opening area. In this example, the holes 4c are regularly spaced in the X direction and lined up. The holes 4c are disposed in a plurality of (in FIG. 8, three) lines arranged in the width direction. The holes 4c in adjacent ones of the lines arranged in the X direction are alternately staggered.

The short holes and the slotted holes may be used in combination. The diameter of the opening area of the short holes and the opening width of the slotted holes are preferably not less than 5 μm, more preferably not less than 50 μm, and further preferably not less than 100 μm from the viewpoint of effectively preventing the warpage of the opto-electric hybrid board sheet. This is because the effect of preventing the warpage tends to be weakened if the diameter and the opening width are too small.

The holes 4a to 4c in the under cladding layer 4 are through holes formed through the under cladding layer 4 in the aforementioned embodiments, but may be blind holes not formed through the under cladding layer 4. The through holes 4a to 4c formed through the under cladding layer 4 and the blind holes 4a to 4c not formed through the under cladding layer 4 may be used in combination.

The opto-electric hybrid board sheets are produced through the roll-to-roll step in the aforementioned embodiments, but may be produced by a batch process. In this case, the warpage occurs in all directions. It is hence preferable that the holes (slotted holes) 4a and 4b in the under cladding layer 4 are formed so that the longitudinal direction thereof is set in all directions.

In the aforementioned embodiments, the area percentage of the opening area of the holes 4a to 4c is in the range of 5% to 99% with respect to the front surface of the insulative sheet 1. However, the area percentage is preferably in the range of 35% to 99% from the viewpoint of preventing the warpage of the opto-electric hybrid board sheet. This is because the prevention of warpage tends to be weakened if the area percentage is too low.

The area percentage of the opening area of the holes 4a to 4c on the insulative substrate of each of the opto-electric hybrid boards R is preferably in the range of 5% to 99% with respect to the front surface of the insulative substrate from the viewpoint of preventing warpage of the opto-electric hybrid boards R. This is because the prevention of warpage of the opto-electric hybrid boards R obtained by cutting from the opto-electric hybrid board sheet tends to be weakened if the area percentage is too low, and because the under cladding layer 4 does not tend to be formed sufficiently if the area percentage is too high.

The area percentage of the opening area of the holes 4a to 4c on an insulative sheet portion lying between adjacent ones of the opto-electric hybrid boards R is preferably in the range of 5% to 99% with respect to the front surface of the insulative sheet portion from the viewpoint of preventing the warpage of the opto-electric hybrid boards R. This is because the prevention of warpage tends to be weakened if the area percentage is too low.

In the aforementioned embodiments, the electric circuit board sheet in which the electric circuits 2 are previously formed on the back surface of the insulative strip-shaped sheet is used in the production of the opto-electric hybrid board sheets. However, an insulative strip-shaped sheet on which the electric circuits 2 are not formed may be used. In this case, the opto-electric hybrid board sheets are produced in a manner to be described below. First, the under cladding layer 4, the cores 5, and the over cladding layer 6 are formed on the front surface of the insulative strip-shaped sheet in the same manner as in the aforementioned embodiments. Then, the resultant structure is cut into optical circuit board sheets S (with reference to FIGS. 1B and 1C) corresponding to the opto-electric hybrid board sheets. Thereafter, the electric circuits 2 are formed in predetermined positions on the back surface of the insulative strip-shaped sheet. In this case, the optical circuit board sheets S have little or no warpage. This causes no cracking in the cores 5.

The single opto-electric hybrid board sheet has the plurality of opto-electric hybrid boards R in the aforementioned embodiments, but may have only one opto-electric hybrid board R.

The stainless steel layer 3 in the aforementioned embodiments serves as a reinforcement layer for the mounting of the optical element, as mentioned earlier. However, the stainless steel layer 3 may be dispensed with, as required.

The over cladding layer 6 is formed in the aforementioned embodiments, but need not be formed. Specifically, a cladding (air cladding) made of air may be used in place of the over cladding layer 6 made of a resin. This provides a greater difference in refractive index between the cores 5 and air (air cladding) to make light propagating in the cores 5 less prone to leak from the cores 5.

Next, inventive examples of the present disclosure will be described in conjunction with comparative examples. It should be noted that the present disclosure is not limited to the inventive examples.

EXAMPLES

Inventive Example 1

The opto-electric hybrid board sheet shown in FIGS. 1A to 1C was produced through a roll-to-roll step. The opto-electric hybrid board sheet had the following dimensions: 44 mm (length in the X direction)×251.9 mm (width). Opto-electric hybrid boards had the following dimensions: square portions measuring 8 mm×8 mm; rectangular portions measuring 3 mm×36 mm; a distance of 2 mm between adjacent ones of the square portions; and a distance of 6.8 mm between adjacent ones of the rectangular portions. Elongated holes in the opto-electric hybrid boards had an opening width of 110 μm, and a spacing of 250 μm therebetween.

Inventive Example 2

The opto-electric hybrid board sheet shown in FIG. 2 was produced through the roll-to-roll step. The elongated holes had the same dimensions as those in Inventive Example 1. The remaining parts were the same as those in Inventive Example 1.

Inventive Example 3

An under cladding layer measuring 0.8 mm×36 mm and spaced 0.1 mm apart from side end edges of the rectangular portion of an insulative substrate of each of the opto-electric hybrid boards was additionally formed along the rectangular portion in Inventive Example 1. The remaining parts were the same as those in Inventive Example 1.

Inventive Example 4

The opto-electric hybrid board sheet shown in FIG. 3 was produced through the roll-to-roll step. Two cores had a width of 140 μm, a length of 42 mm, and a gap width of 110 μm therebetween. The remaining parts were the same as those in Inventive Example 1.

Inventive Example 5

The elongated holes had an opening width of 20 μm in Inventive Example 2. The remaining parts were the same as those in Inventive Example 2.

Inventive Example 6

The opto-electric hybrid board sheet shown in FIG. 4 was produced through the roll-to-roll step. The two cores of each of the opto-electric hybrid boards had the same dimensions as those in Inventive Example 4. The elongated holes formed in the under cladding layer in a portion other than the opto-electric hybrid boards had an opening width of 10 μm, and a spacing of 250 μm therebetween. The remaining parts were the same as those in Inventive Example 1.

Inventive Example 7

The under cladding layer was formed on a portion of an insulative sheet other than the insulative substrate of each of the opto-electric hybrid boards in Inventive Example 5, and the same elongated holes as in Inventive Example 6 were formed in the under cladding layer. The remaining parts were the same as those in Inventive Example 5.

Inventive Example 8

The opto-electric hybrid board sheet shown in FIG. 5 was produced through the roll-to-roll step. Elongated holes extending in the width direction had an opening width of 10 μm, and a spacing of 12 mm therebetween. The remaining parts were the same as those in Inventive Example 7.

Inventive Example 9

The opto-electric hybrid board sheet shown in FIG. 6 was produced through the roll-to-roll step. The elongated holes extending in the width direction had the same dimensions as those in Inventive Example 8. The remaining parts were the same as those in Inventive Example 7.

Inventive Example 10

The opto-electric hybrid board sheet shown in FIG. 7 was produced through the roll-to-roll step. The elongated holes extending in the width direction had the same dimensions as those in Inventive Example 8. The remaining parts were the same as those in Inventive Example 7.

Inventive Example 11

Figure 8:
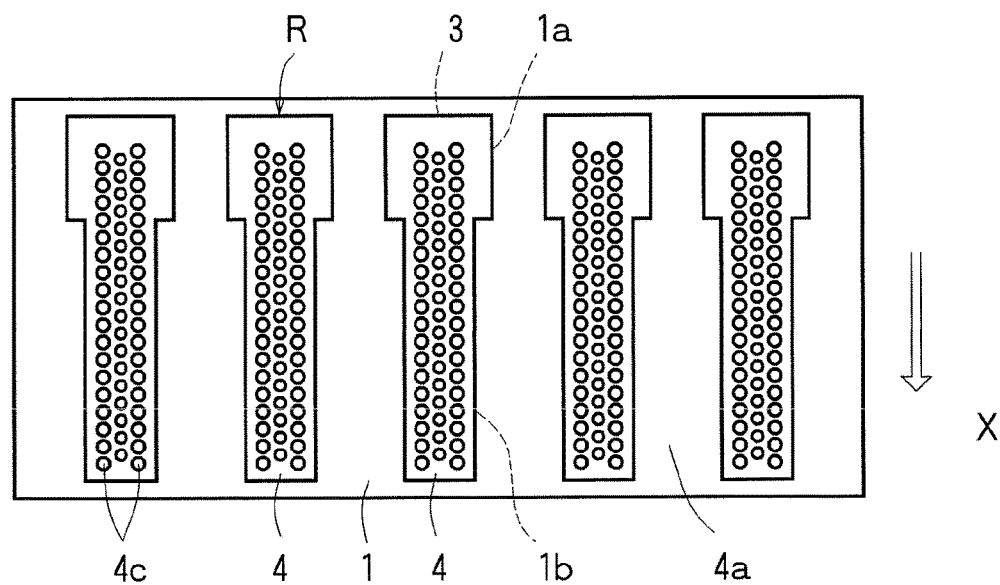
FIG. 8 is a schematic plan view showing still another modification of the opto-electric hybrid board sheet.
Figure 9:
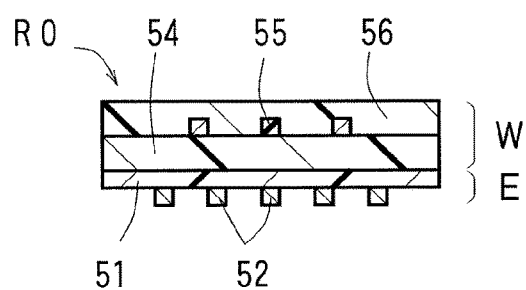
FIG. 9 is a schematic sectional view showing a conventional opto-electric hybrid board.
Figure 10:
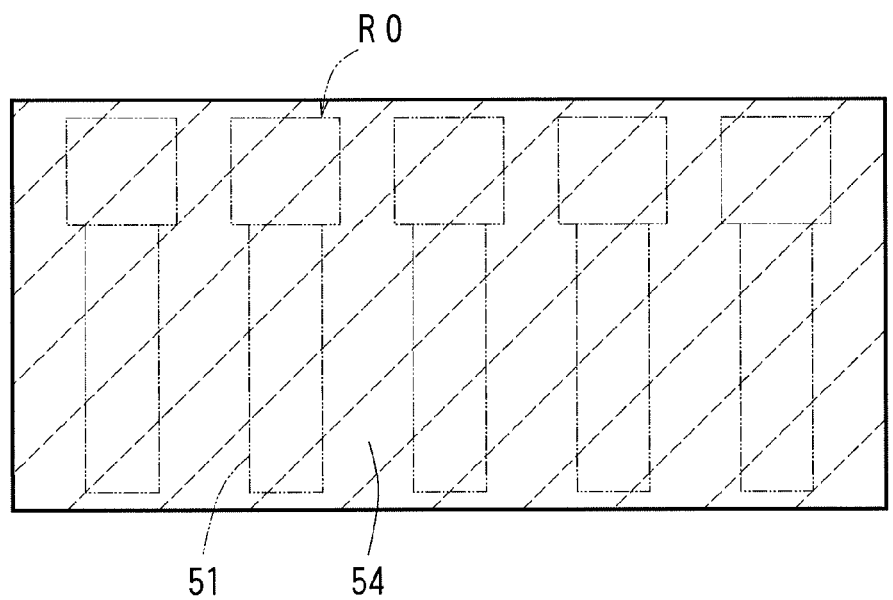
FIG. 10 is a schematic sectional view showing a conventional opto-electric hybrid board sheet.

The opto-electric hybrid board sheet shown in FIG. 8 was produced through the roll-to-roll step. Holes had an opening area with a radius of 40 μm, a spacing of 240 μm therebetween in the X direction, and a spacing of 250 μm therebetween in the width direction. The remaining parts were the same as those in Inventive Example 1.

Comparative Example 1

The under cladding layer was formed on the entire surface of the insulative sheet. Elongated holes having an opening width of 200 μm were formed in portions of the under cladding layer which correspond to inside from side end edges of an insulative substrate of each opto-electric hybrid board. The remaining parts were the same as those in Inventive Example 1.

Comparative Example 2

Elongated holes having an opening width of 200 μm and extending in the direction of the flow of a base material for production in the roll-to-roll process were additionally formed in the middle of a portion of the under cladding layer formed in an insulative sheet portion between adjacent ones of the opto-electric hybrid boards in Inventive Example 11. The remaining parts were the same as those in Inventive Example 1.

Comparative Example 3

The under cladding layer was formed on the entire surface of the insulative sheet. No holes were formed in the under cladding layer. The remaining parts were the same as those in Inventive Example 1.

[Area Percentage of Opening Area of Holes]

Using a digital microscope (VHX-5000 available from Keyence Corporation), the dimensions of the opening area of the holes formed in the under cladding layer were measured for the opto-electric hybrid board sheets in Inventive Examples 1 to 11 and Comparative Examples 1 to 3. Then calculated were the area percentage of the opening area of the holes on the insulative substrate of each of the opto-electric hybrid boards (products) with respect to the front surface of the insulative substrate, the area percentage of the opening area of the holes on the insulative sheet portion lying between adjacent ones of the opto-electric hybrid boards with respect to the front surface of the insulative sheet portion, and the area percentage of the opening area of the holes with respect to the front surface of the insulative sheet of each of the opto-electric hybrid board sheets (product sheets). The results were listed in TABLE 1 below.

[Amounts of Warpage]

The amount of warpage between adjacent ones of the opto-electric hybrid boards in each of the opto-electric hybrid board sheets in Inventive Examples 1 to 11 and Comparative Examples 1 to 3 was measured using a stylus surface profiler (DEKTAK8 available from Ulvac, Inc.). The opto-electric hybrid boards were cut from each of the opto-electric hybrid board sheets, and the amount of warpage in the opto-electric hybrid boards was measured in the same manner as described above. These results were listed in TABLE 1 below.

[Comprehensive Judgment]

The presence/absence of cracking in the cores in each of the opto-electric hybrid board sheets in Inventive Examples 1 to 11 and Comparative Examples 1 to 3 was determined by viewing the cores which were magnified 20 times with the use of an optical microscope. The cracking in the cores and the amounts of warpage were judged based on evaluation criteria to be described below, and the results were listed in TABLE 1 below.

∘∘: Cracking is absent; and the amounts of warpage are not greater than 40 μm.

∘: Cracking is absent; and the amounts of warpage are greater than 40 μm and not greater than 60 μm.

Δ: Cracking is absent; and the amounts of warpage are greater than 60 μm and not greater than 80 μm.

x: Cracking is present; and the amounts of warpage are greater than 60 μm.

TABLE 1

| | Area percentage of opening area (%) | | | Opening width (μm) | Amounts of warpage (μm) | | Comprehensive judgment |
|---|---|---|---|---|---|---|---|
| | In product | Between products | Product sheet | | In product | Between products | |
| Inv. Ex. 1 | 58 | 100 | 84 | 110 | 40 or less | 20 or less | ∘∘ |
| Inv. Ex. 2 | 45 | 100 | 79 | | | | |
| Inv. Ex. 3 | 58 | 79 | 71 | | | | |
| Inv. Ex. 4 | 94 | 100 | 98 | | | | |
| Inv. Ex. 5 | 10 | 100 | 65 | 20 | 60 | | ∘ |
| Inv. Ex. 6 | 94 | 7.7 | 41 | 10 | 40 or less | 60 | |
| Inv. Ex. 7 | 6.2 | 7.7 | 7.1 | | 80 | | Δ |
| Inv. Ex. 8 | 6.3 | 7.8 | 7.2 | | | | |
| Inv. Ex. 9 | 6.3 | 7.7 | 7.2 | | | | |
| Inv. Ex. 10 | 6.2 | 7.8 | 7.2 | | | | |
| Inv. Ex. 11 | 11 | 100 | 65 | 80 | 60 | 20 or less | ∘ |
| Comp. Ex. 1 | 3.0 | 3.8 | 3.5 | 200 | 140 | 140 or more | x |

TABLE 1-continued

| | Area percentage of opening area (%) | | | Opening width (μm) | Amounts of warpage (μm) | | Comprehensive judgment |
|---|---|---|---|---|---|---|---|
| | In product | Between products | Product sheet | | In product | Between products | |
| Comp. Ex. 2 | 3.0 | 4.6 | 4.0 | | | 140 | |
| Comp. Ex. 3 | 0 | 0 | 0 | 0 | 140 or more | 140 or more | |

The aforementioned results in TABLE 1 show that cracking is absent in the cores in Inventive Examples 1 to 11. In particular, it is found that the amount of warpage between adjacent ones of the opto-electric hybrid boards and the amount of warpage in the opto-electric hybrid boards are small in Inventive Examples 1 to 4. It is found that the reason lies in the high area percentage of the opening area of the holes. On the other hand, it is found that cracking is present in the cores and the aforementioned amounts of warpage are large in Comparative Examples 1 to 3. It is found that the reason lies in that the area percentage of the opening area of the holes is as low as less than 5%. As the amount of warpage between adjacent ones of the opto-electric hybrid boards increases, the amount of warpage in every opto-electric hybrid board sheet itself increases.

Optical circuit board sheets produced in the same manner as in Inventive Examples 1 to 11 using the insulative strip-shaped sheet on which no electric circuits were formed showed results that cracking was absent in the cores and the amounts of warpage were small in the same manner as described above.

Although specific forms in the present disclosure have been described in the aforementioned examples, the aforementioned examples should be considered as merely illustrative and not restrictive. It is contemplated that various modifications evident to those skilled in the art could be made without departing from the scope of the present disclosure.

The optical circuit board sheet and the opto-electric hybrid board sheet according to the present disclosure are applicable to instances in which cracking in the cores is prevented by eliminating or reducing warpage.

REFERENCE SIGNS LIST

R Opto-electric hybrid boards
S Optical circuit board sheet
1 Insulative sheet
2 Electric circuits
4 Under cladding layer
4a Holes
5 Cores

The invention claimed is:

1. An optical circuit board sheet, comprising:
an insulative sheet; and
a plurality of optical circuit boards formed on the insulative sheet, each of the plurality of optical circuit boards including
an under cladding layer formed on a first surface of the insulative sheet; and
at least one core formed on a surface of the under cladding layer,
wherein a first hole is formed in a portion of the surface of the under cladding layer at a first position other than where the core is formed, between the under cladding layers of adjacent optical circuit boards of the plurality of optical circuit boards,
wherein a second hole is formed in a portion of the surface of the under cladding layer at a second position other than where the core is formed, within the under cladding layer of each of the optical circuit boards of the plurality of optical circuit boards, and
wherein an area percentage of an opening area of the hole is in a range of 5% to 99% with respect to the first surface of the insulative sheet.

2. The optical circuit board sheet according to claim 1, wherein the area percentage of the opening area of the hole is in a range of 35% to 99% with respect to the first surface of the insulative sheet.

3. The optical circuit board sheet according to claim 1, wherein the hole is an elongated hole.

4. The optical circuit board sheet according to claim 3, wherein the elongated hole has an opening width of not less than 100 μm.

5. An opto-electric hybrid board sheet comprising:
the optical circuit board sheet according to claim 1, and
at least one electric circuit formed on a second surface of an insulative sheet of the optical circuit board sheet,
wherein the opto-electric hybrid board sheet is configured to be cut into a plurality of opto-electric hybrid boards, each of the plurality of opto-electric hybrid boards comprising:
an insulative substrate formed from a portion of the insulative sheet, and
the electric circuit, the under cladding layer, and the core which are formed on the insulative substrate.

6. The optical circuit board sheet according to claim 1, wherein each of the plurality of optical circuit boards further comprises a reinforcement layer contacting the under cladding layer.

7. The optical circuit board sheet according to claim 6, wherein the reinforcement layer is formed of stainless steel.

8. The optical circuit board sheet according to claim 1, wherein a width of the first hole is different from a width of the second hole.

* * * * *